(12) United States Patent
Rao (10) Patent No.: US 8,521,951 B2
(45) Date of Patent: Aug. 27, 2013

(54) CONTENT ADDRESSABLE MEMORY AUGMENTED MEMORY

(75) Inventor: G. R. Mohan Rao, McKinney, TX (US)

(73) Assignee: S. Aqua Semiconductor LLC, Wilmington, DE (US)

( * ) Notice: Subject to any disclaimer, the term of this patent is extended or adjusted under 35 U.S.C. 154(b) by 823 days.

(21) Appl. No.: 12/015,430

(22) Filed: Jan. 16, 2008

(65) Prior Publication Data

US 2009/0182938 A1    Jul. 16, 2009

(51) Int. Cl.
*G06F 13/12*       (2006.01)
(52) U.S. Cl.
USPC .................................. 711/108; 711/E12.001
(58) Field of Classification Search
USPC .......................................................... 711/108
See application file for complete search history.

(56) References Cited

U.S. PATENT DOCUMENTS

| | | | |
|---|---|---|---|
| 4,750,154 A | | 6/1988 | Lefsky et al. |
| 5,404,482 A | * | 4/1995 | Stamm et al. .................. 711/145 |
| 5,696,937 A | | 12/1997 | White et al. |
| 5,749,087 A | * | 5/1998 | Hoover et al. ................. 711/108 |
| 5,787,267 A | * | 7/1998 | Leung et al. ................... 711/105 |
| 5,835,932 A | | 11/1998 | Rao |
| 5,856,940 A | | 1/1999 | Rao |
| 5,887,146 A | | 3/1999 | Baxter et al. |
| 5,890,195 A | | 3/1999 | Rao |
| 5,905,997 A | | 5/1999 | Stiles et al. |
| 5,926,620 A | * | 7/1999 | Klein ............................... 714/5 |
| 6,026,461 A | * | 2/2000 | Baxter et al. ................... 710/244 |
| 6,504,785 B1 | | 1/2003 | Rao |
| 6,748,480 B2 | | 6/2004 | Chudnovsky et al. |
| 6,829,184 B2 | | 12/2004 | Khandekar et al. |
| 6,976,121 B2 | | 12/2005 | Khandekar et al. |
| 7,050,351 B2 | | 5/2006 | Halbert et al. |
| 7,054,999 B2 | | 5/2006 | Bains et al. |
| 7,127,574 B2 | | 10/2006 | Rotithor et al. |
| 7,200,713 B2 | | 4/2007 | Cabot et al. |
| 7,206,866 B2 | | 4/2007 | Hendel et al. |
| 2002/0108094 A1 | * | 8/2002 | Scurry .............................. 716/5 |
| 2005/0132131 A1 | | 6/2005 | David |
| 2007/0005934 A1 | | 1/2007 | Rotithor et al. |
| 2008/0270826 A1 | * | 10/2008 | Shaw et al. ....................... 714/6 |

FOREIGN PATENT DOCUMENTS

WO    99/26139 A1    5/1999

OTHER PUBLICATIONS

Kostas Pagiamtzis, home: articles: Content-Addressable Memory Introduction, Jun. 25, 2007, pp. 1-5., www.pagiamtzis.com.
International Search Report and Written Opinion mailed Apr. 27, 2009 for PCT/US2009/031327.
International Preliminary Report on Patentability, issued in International Application No. PCT/US2009/031327, mailed Jul. 29, 2010, 7 pages.

* cited by examiner

*Primary Examiner* — Kenneth Lo
(74) *Attorney, Agent, or Firm* — Schwabe, Williamson & Wyatt, P.C.

(57) ABSTRACT

Embodiments of the present disclosure provide methods, apparatuses, and systems including a memory device including content addressable memory configured to store an address associated with one or more memory cells while an access operation is performed on the one or more memory cells. Other embodiments may be described.

16 Claims, 5 Drawing Sheets

CONTENT ADDRESSABLE MEMORY AUGMENTED MEMORY

TECHNICAL FIELD

Embodiments of the present disclosure relate to the field of integrated circuits, and, more specifically, to digital memory apparatuses and systems including content addressable memory.

BACKGROUND

Semiconductor memories play a vital role in many electronic systems. Their functions for data storage, code (instruction) storage, and data retrieval/access continue to span a wide variety of applications. Usage of these memories in both stand alone/discrete memory product forms, as well as embedded forms such as, for example, memory integrated with other functions like logic, in a module or monolithic integrated circuit, continues to grow. Cost, operating power, bandwidth, latency, ease of use, the ability to support broad applications, and nonvolatility are all desirable attributes in a wide range of applications.

In page architecture memory systems, opening a page of memory may prevent access to another page of the memory bank. This may effectively increase access and cycle times. In multi-processor or multi-core systems, attempts to access memory in parallel while running different applications may compound the delays due to locked up memory banks.

BRIEF DESCRIPTION OF THE DRAWINGS

Embodiments of the present disclosure will be readily understood by the following detailed description in conjunction with the accompanying drawings. Embodiments of the disclosure are illustrated by way of example and not by way of limitation in the figures of the accompanying drawings.

DETAILED DESCRIPTION OF EMBODIMENTS OF THE DISCLOSURE

In the following detailed description, reference is made to the accompanying drawings which form a part hereof, and in which are shown by way of illustration embodiments in which the disclosure may be practiced. It is to be understood that other embodiments may be utilized and structural or logical changes may be made without departing from the scope of the present disclosure. Therefore, the following detailed description is not to be taken in a limiting sense, and the scope of embodiments in accordance with the present disclosure is defined by the appended claims and their equivalents.

Various operations may be described as multiple discrete operations in turn, in a manner that may be helpful in understanding embodiments of the present disclosure; however, the order of description should not be construed to imply that these operations are order dependent.

The description may use the phrases "in an embodiment," or "in embodiments," which may each refer to one or more of the same or different embodiments. Furthermore, the terms "comprising," "including," "having," and the like, as used with respect to embodiments of the present disclosure, are synonymous.

The term "access operation" may be used throughout the specification and claims and may refer to read, write, or other access operations to one or more memory devices.

Various embodiments of the present disclosure may include a digital memory device, such as, but not limited to, random access memory (RAM) device including content addressable memory configured to store at least an address associated with one or more memory cells of a subset of a plurality of memory cells while an access operation is performed on the one or more memory cells. The stored address may indicate, to a processor, for example, that the one or more memory cells associated with the stored address are busy or otherwise inaccessible at that particular time. Such an indication may reduce the number of cycles wasted due to stalling if the requested address is unavailable.

In further embodiments, the content addressable memory may be configured to copy and store data corresponding to at least the address when the access operation is initiated, and to selectively output the stored data to satisfy the access operation. Copying and storing the data may allow memory cells of the subset to freed up or otherwise made available for some subsequent access operation.

Figure 1:
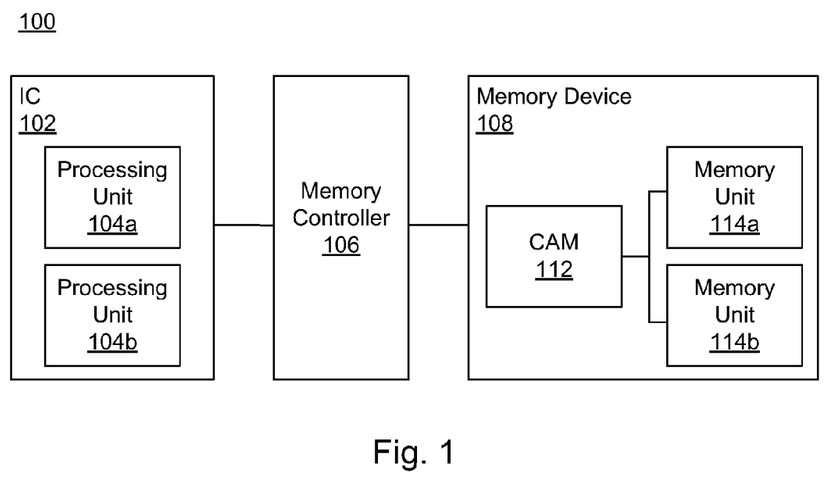
FIG. 1 illustrates a functional system block diagram including an exemplary digital memory device including a content addressable memory in accordance with various embodiments of the present disclosure.

Referring now to FIG. 1, illustrated is a functional block diagram of a system 100 comprising an exemplary digital memory device 108 including one or more memory units 114*a*, 114*b* and a content addressable memory (CAM) device 112 in accordance with various embodiments of the present disclosure. System 100 may include one or more processors 104*a*, 104*b*, and may include a memory controller 106 operatively coupled to memory device 108 for selectively routing signals between memory device 108 and processors 104*a*, 104*b* to control access operations to memory device 108. Processors 104*a*, 104*b* may be stand-alone processors or core processors disposed on a single integrated circuit 102.

CAM 112 may be configured to store at least one address associated with one or more memory cells of memory units 114*a*, 114*b* being accessed. Each of memory units 114*a*, 114*b* may comprise some subset of memory such as, for example, a memory bank and/or a memory page, and each subset may comprise a plurality of memory cells. Although the illustrated embodiment depicts memory device 108 as including two memory units 114*a*, 114*b*, memory device 108 may include more or less memory units according to various embodiments within the scope of the disclosure.

In various embodiments, CAM 112 may be configured to store at least one address of one or more memory cells of one or more of memory units 114*a*, 114*ba* while an access operation is performed on the one or more memory cells. In various embodiments, the stored address may indicate to one or more of processors 104*a*, 104*b* that the one or more memory cells associated with the stored address are busy or otherwise inaccessible at that particular time. In embodiments wherein a memory unit 114*a* or 114*b* comprises a memory page, a stored address may be employed to indicate a busy state of the memory page. Similarly, in embodiments wherein a memory unit 114*a* or 114*b* comprises a memory bank, a stored address may be employed to indicate a busy state of the memory bank.

In various embodiments, one or more of processors 104*a*, 104*b* may present an address for an access operation to memory device 108, and CAM 112 may determine whether the address is already stored in CAM 112. CAM 112 may determine whether the address is already stored by comparing the presented address to those addresses stored in CAM 112 in, for example, an address lookup table. If the address is already stored in CAM 112, CAM 112 may indicate to processors 104*a*, 104*b* that the one or more memory cells associated with the stored address are busy. Such an indication may include, for example, a signal on an output pin of memory device 108.

If, on the other hand, the address is not already stored in CAM 112, CAM 112 may indicate to processors 104*a*, 104*b* that the one or more memory cells associated with the stored address are available. Such an indication may include a signal, in particular, a "no hit" or "no match" signal, on an output pin of memory device 108. CAM 112 may, in various embodiments, present the address to the plurality of memory cells of memory device 108 to output data associated with the address (e.g., during a read operation). CAM 112 may store the address, at least momentarily, for indicating to one or more of processors 104*a*, 104*b* that the one or more memory cells associated with the newly stored address are busy or otherwise inaccessible at that particular time. In various ones of these embodiments, CAM 112 may store the address during substantially the entire access operation and remove the address after the access operation is completed, which may advantageously allow for a substantially realtime indication of memory availability. As used herein, references to "removing" an address may include, but is not limited to, deleting and/or modifying the address (by, e.g., overwriting with a default address or another address) or marking the stored address invalid (by, e.g., setting an appropriate associated bit).

In further embodiments, CAM 112 may be configured to copy and store data corresponding to at least an address associated with one or more memory cells of memory unit 114*a* or 114*b* when an access operation is initiated. Copying and storing the data may allow memory cells of the memory unit to be freed up or otherwise made available for some subsequent access operation. The cached data may be, in embodiments, selectively output to satisfy the access operation and/or a subsequent access operation.

CAM 112 may be configured to store a plurality of addresses or a plurality of addresses and data associated thereto. For example, in various embodiments, CAM 112 may be configured to store a first address and data associated with a first one or more memory cells of a plurality of memory cells, and also to store a second address and data associated with a second one or more memory cells of the plurality of memory cells. In various ones of these embodiments, a first access operation may be satisfied by the first address/data copied and stored in CAM 112 concurrently with a second access operation being performed on the second address/data.

In various embodiments, the first one or more memory cells of the plurality of memory cells and the second one or more memory cells of the plurality of memory cells may be disjoint subsets or may be intersecting/non-disjoint subsets. In embodiments wherein the first a one or more memory cells and the second one or more memory cells are intersecting/non-disjoint subsets, the first access operation and the second access operation usually will be read operations to avoid conflicts such as, for example, data incoherence. On the other hand, in embodiments wherein the first one or more memory cells and the second one or more memory cells are disjoint subsets, various parallel access operations may be performed on the first one or more memory cells and the second one or more memory cells. For example, a read or a write operation may be performed on the first one or more memory cells while a read or a write operation is performed on the second one or more memory cells.

The memory cells of memory units 114*a*, 114*b* may be memory cells of any type. For example, the memory cells may be volatile dynamic random access memory (DRAM) cells or static random access memory (SRAM) cells, or nonvolatile memories like flash memory, depending on the application. Further, while not illustrated, memory device 108 may include sense amplifier circuits, decoders, and/or logic circuitry, depending on the application.

Memory device 108 may comprise a discrete device or may comprise a system of elements, depending on the application. For example, in various embodiments, CAM 112 and memory units 114*a*, 114*b* of memory device 108 may comprise a memory module such as, for example, a dual in-line memory module (DIMM). A DIMM may comprise an advanced memory buffer (AMB), and in various ones of these embodiments, the AMB may include CAM 112. In various other embodiments, CAM 112 and memory units 114*a*, 114*b* may be co-located on a single integrated circuit.

In various embodiments, the memory controller 106 may be operatively coupled (by, e.g., a bus) to at least one of processors 104*a*, 104*b* and a memory device 108 and its included elements, or may be incorporated into memory device 108. CAM 112 may include, for example, memory controller 106.

Memory device 108 may be accessed by one or more of processors 104*a*, 104*b*. In the illustrated embodiment, two processors 104*a*, 104*b* are coupled to memory device 108. In various embodiments, however, more or fewer processors may be coupled to memory device 108. In various embodiments, processors 104*a*, 104*b* may comprise processing units or processor cores. For example, processors 104*a*, 104*b* may comprise dual-core or multi-core processors. Additionally, the processing units may be disposed remotely from each other, or they may be implemented as processing cores commonly disposed on a single integrated circuit 102. Processors 104*a*, 104*b* may be coupled to memory device 108 via various elements and may access and precharge various memory units in parallel.

Figure 2:
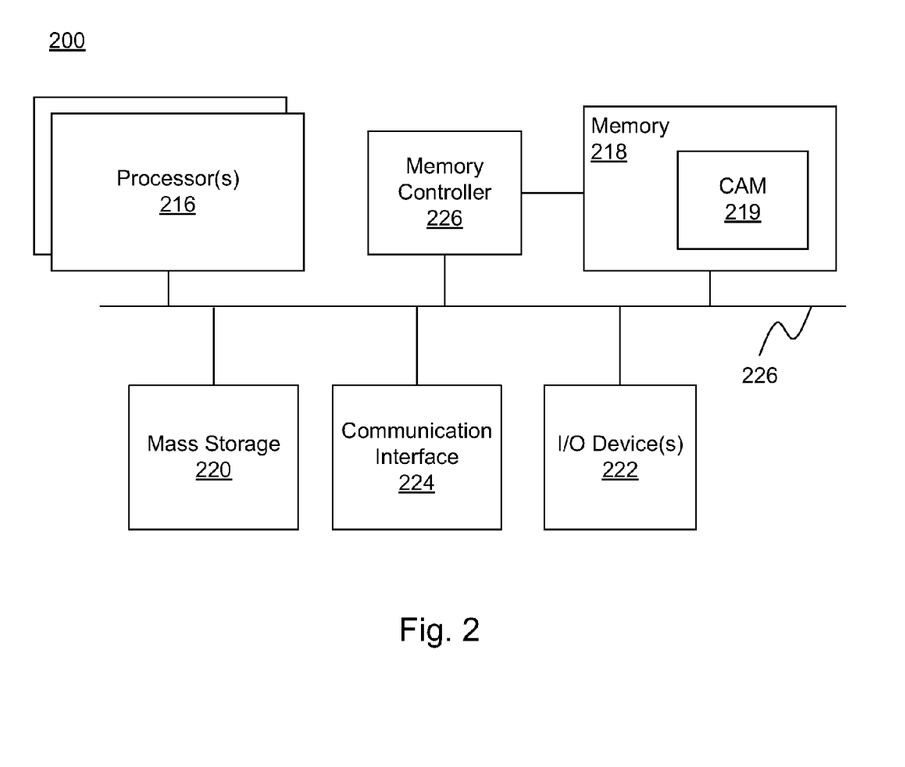
FIG. 2 illustrates an exemplary computing system including a memory device including a content addressable memory suitable for practicing the disclosure, in accordance with various embodiments.

FIG. 2 illustrates an exemplary computing system 200 incorporating embodiments of the present disclosure. As illustrated, system 200 may include one or more processors 216, and system memory 218, such as, for example, memory device 108 of FIG. 1.

In various embodiments, system memory 218 may include a CAM 219, such as for example, CAM 112 of FIG. 1. CAM 219 may be configured to store at least an address associated with one or more memory cells of memory 218 while an access operation is performed on the one or more memory cells. The stored address may indicate, to one or more of processors 216, for example, that the one or more memory cells associated with the stored address are busy or otherwise inaccessible at that particular time. In further embodiments, CAM 219 may be configured to copy and store data corresponding to at least the address when the access operation is initiated, and to selectively output the stored data to satisfy the access operation. Copying and storing the data may allow memory cells to be freed up or otherwise made available for some subsequent access operation.

Additionally, computing system 200 may include mass storage devices 220 (such as, e.g., diskette, hard drive, CDROM, and the like), input/output devices 222 (such as, e.g., keyboard, cursor control, and the like), and communication interfaces 224 (such as, e.g., network interface cards, modems, and the like). The elements may be coupled to each other via system bus 226, which may represent one or more buses. In the case of multiple buses, they may be bridged by one or more bus bridges (not illustrated).

System 200 may include at least one memory controller 226 embodied with some or all of the teachings of the present disclosure. Memory controller 226 may be configured to operate system memory 218. In embodiments, memory controller 226 may be configured, for example, to issue read and write access commands to system memory 218. In alternative embodiments, system memory 218 may include a controller (not illustrated) to perform some or all of the functions of memory controller 226. In embodiments, some or all of the functions of controller 226 could be effectively implemented within system memory 218. In embodiments, such functions may be performed by use of a mode register within system memory 218.

Other than the teachings of the various embodiments of the present disclosure, each of the elements of computer system 200 may perform its conventional functions known in the art. In particular, system memory 218 and mass storage 220 may be employed to store a working copy and a permanent copy of programming instructions implementing one or more software applications.

Although FIG. 2 depicts a computer system, one of ordinary skill in the art will recognize that embodiments of the present disclosure may be practiced using other devices that utilize DRAM or other types of digital memory such as, but not limited to, mobile telephones, Personal Data Assistants (PDAs), gaming devices, high-definition television (HDTV) devices, appliances, networking devices, digital music players, laptop computers, portable electronic devices, telephones, as well as other devices known in the art.

Figure 3:
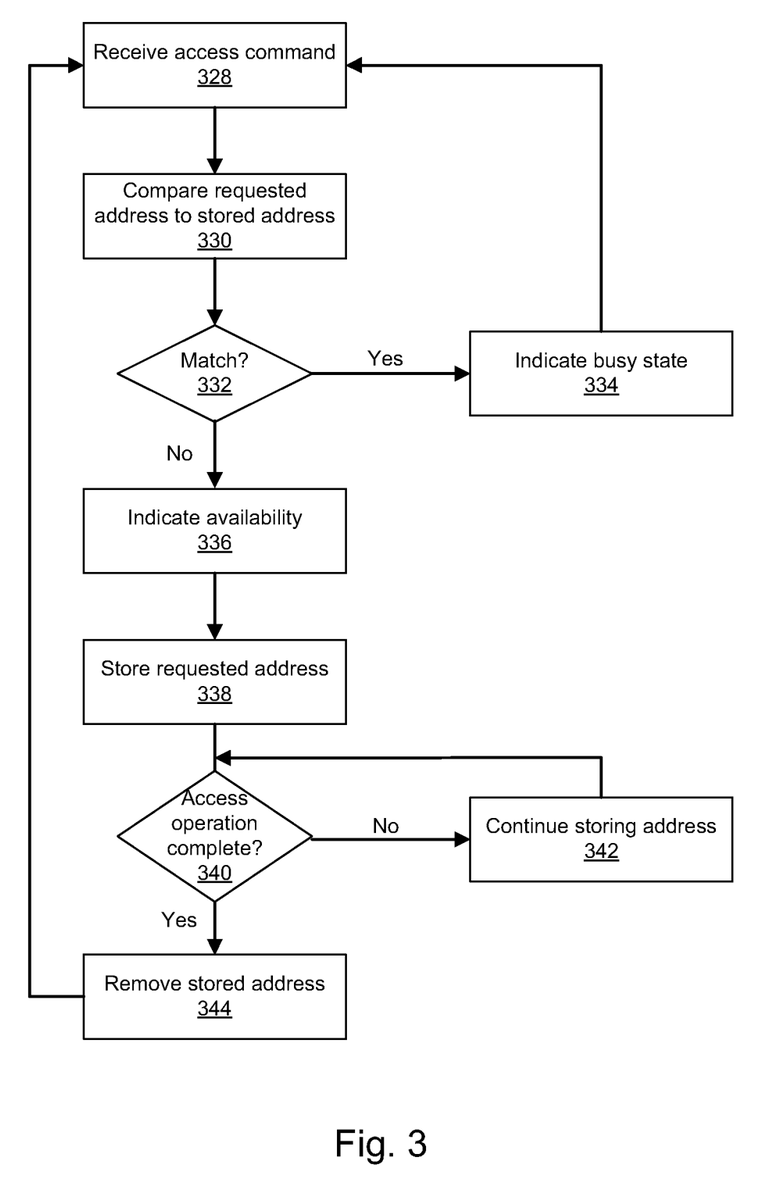
FIG. 3 illustrates a flow chart of a method implementing a memory device including a content addressable memory in accordance with various embodiments of the present disclosure.
Figure 4:
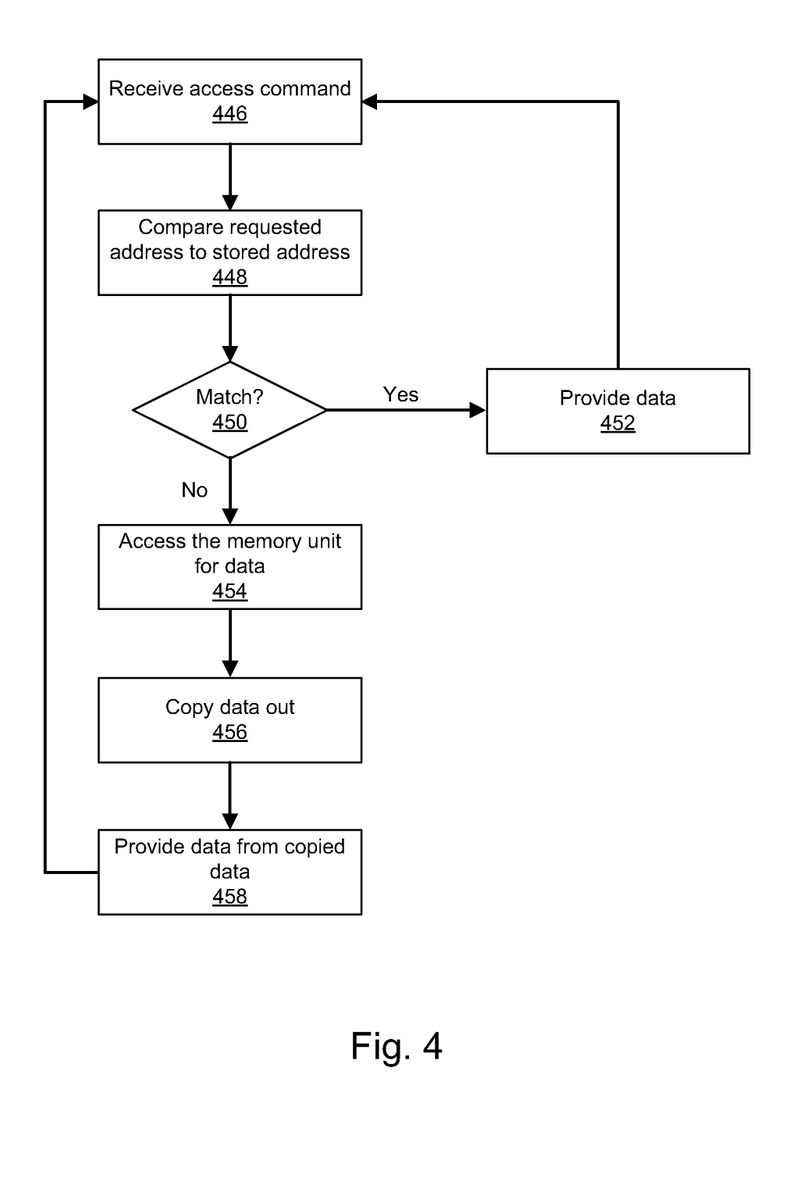
FIG. 4 illustrates a flow chart of another method implementing a memory device including a content addressable memory in accordance with various embodiments of the present disclosure.

Referring now to FIG. 3 and FIG. 4, flow charts of exemplary methods of operation of a memory device are illustrated. With respect to FIG. 3, at block 328, an access command, such as, for example, a read or write command, may be received by a memory device including a CAM. The received access command may include an address or identifier corresponding to one or more memory cells of a memory unit to be accessed. The received address may be compared at block 330 to addresses stored in the CAM. If it is determined at query block 332 that an address matching the requested address is already stored in the CAM, a busy state may be indicated at block 334.

If, on the other hand, it is determined at query block 332 that a matching address is not already stored in the CAM, an indication of availability of the memory cells corresponding to the requested address may be provided at block 336. In various embodiments, the requested address may be stored at block 338 for indicating a busy state in response to subsequent access commands to that address. At query block 340, a determination is made as to whether the access operation is complete. The CAM may continue storing the address at block 342 if the access operation is not yet complete, whereas the address may be removed from the CAM at block 344 after the access operation is completed.

In further embodiments and as illustrated in FIG. 4, the CAM may be configured to copy and store data corresponding to an address of a one or more memory cells of a memory unit when an access operation is initiated, and to selectively output the stored data to satisfy the access operation or another access operation.

At block 446, an access command, such as, for example, a read or write command, may be received by a memory device including a CAM. The received access command may include an address or identifier corresponding to one or more memory cells of a memory unit to be accessed. The received address may be compared at block 448 to addresses stored in the CAM. If it is determined at query block 450 that an address matching the requested address is already stored in the CAM, the data associated with the address (and already stored in the CAM) is provided at block 452 in response to the access command.

If, on the other hand, it is determined that an address matching the requested address is not already stored in the CAM, the memory unit may be accessed at block 454 for the data. The data corresponding to the requested address may be copied out at block 456 and may be provided at block 458 in response to the access command.

Figure 5:
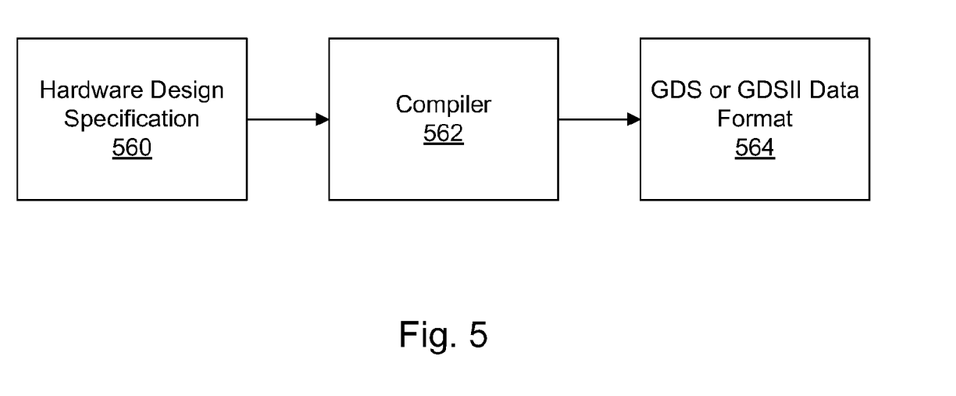
FIG. 5 illustrates a block diagram of a hardware design specification being compiled into GDS or GDSII data format in accordance with various embodiments.

As noted herein, in various embodiments, memory cells as described herein may be embodied in an integrated circuit. The integrated circuit may be described using any one of a number of hardware design language, such as but not limited to VHDL or Verilog. The complied design may be stored in any one of a number of data format such as, but not limited to, GDS or GDS II. The source and/or compiled design may be stored on any one of a number of media such as but not limited to a digital versatile disk (DVD). FIG. 5 illustrates a block diagram depicting the compilation of a hardware design specification 560, which may be run through a compiler 562 to produce GDS or GDS II data format 564 describing an integrated circuit in accordance with various embodiments.

Although certain embodiments have been illustrated and described herein for purposes of description of a preferred embodiment, it will be appreciated by those of ordinary skill in the art that a wide variety of alternate and/or equivalent embodiments or implementations calculated to achieve the same purposes may be substituted for the embodiments shown and described without departing from the scope of the present disclosure. Those with skill in the art will readily appreciate that embodiments in accordance with the present disclosure may be implemented in a very wide variety of ways. This application is intended to cover any adaptations or variations of the embodiments discussed herein. Therefore, it is manifestly intended that embodiments in accordance with the present disclosure be limited only by the claims and the equivalents thereof.

What is claimed is:

1. An apparatus, comprising:
    a memory device including a plurality of memory cells; and
    a content-addressable memory configured to store:
        a first address stored in the content-addressable memory and associated with one or more memory cells from a first subset of the plurality of memory cells while a first access operation is performed on the one or more memory cells from the first subset, wherein the first subset corresponds to a first memory page; and
        a second address stored in the content-addressable memory and associated with one or more memory cells from a second subset of the plurality of memory cells while a second access operation is performed on the one or more memory cells from the second subset, wherein the second subset corresponds to a second memory page;

wherein, in response to receipt of a command to perform the second access operation having the second address, the apparatus is configured to output a signal on an output pin of the apparatus to indicate a busy state of the first subset, and wherein the outputted signal corresponds to the first address; and wherein the first and second subsets have memory cells in common.

2. The apparatus of claim 1, wherein the content-addressable memory is further configured to remove the stored first address after the first access operation is completed.

3. The apparatus of claim 1, wherein the content-addressable memory is further configured to copy and store data corresponding to at least the first address if the first access operation is initiated and to selectively output the stored data to satisfy the first access operation, and wherein the first access operation includes a read operation.

4. The apparatus of claim 1, further comprising a dual inline memory module (DIMM) including the memory device and the content-addressable memory.

5. The apparatus of claim 4, wherein the DIMM comprises an advanced memory buffer (AMB) including the content-addressable memory.

6. The apparatus of claim 1, wherein the memory device and the content-addressable memory are co-located on an integrated circuit.

7. The apparatus of claim 1, wherein the first access operation includes a read operation.

8. A system, comprising:
a processor;
a memory subsystem including:
  a memory device having a plurality of memory cells; and
  a content-addressable memory configured to store:
  a first address stored in the content-addressable memory and associated with one or more memory cells from a first subset of the plurality of memory cells during performance of a first access operation on the one or more memory cells from the first subset, wherein the first subset corresponds to a first memory page; and
  a second address stored in the content-addressable memory and associated with one or more memory cells from a second subset of the plurality of memory cells during performance of a second access operation on the one or more memory cells from the second subset, wherein the second subset corresponds to a second memory page;
  wherein, in response to receipt of a command to perform the second access operation having the second address, the memory subsystem is configured to output a signal on an output pin to indicate a busy state of the first subset, and wherein the outputted signal corresponds to the first address; and
  wherein memory cells from the first subset intersect with memory cells from the second subset; and a controller coupled to the processor and to the memory subsystem and configured to selectively route signals between the memory device and the processor to control access operations to the memory device.

9. The system of claim 8, wherein the content-addressable memory is further configured to remove the stored first address after the first access operation is completed.

10. The system of claim 8, wherein the content-addressable memory is further configured to copy and store data corresponding to the first address upon initiation of the first access operation.

11. The system of claim 8, wherein the memory subsystem comprises a dual inline memory module (DIMM) including the memory device and the content-addressable memory.

12. A method, comprising:
storing, in a content-addressable memory, a first address associated with a first access operation being performed on a memory unit while the first access operation is being performed, wherein the first address corresponds to one or more memory cells from a first subset of a plurality of memory cells for a memory unit being accessed by the first access operation, and wherein the first subset corresponds to a first memory page;
storing, in the content-addressable memory, a second address associated with one or more memory cells from a second subset of the plurality of memory cells while a second access operation is being performed on the one or more memory cells from the second subset, wherein the second subset corresponds to a second memory page, and wherein the first and second subsets have memory cells in common;
outputting, in response to receipt of a command to perform the second access operation having the second address, a signal on an output pin to indicate a busy state of the first subset, wherein the outputted signal corresponds to the first address; and
removing the stored first address from the content-addressable memory after the first access operation is completed.

13. The method of claim 12, further comprising accessing data stored in the memory unit.

14. The method of claim 13, further comprising copying and outputting the stored data.

15. An article of manufacture comprising a tangible computer-readable storage medium including a plurality of computer-readable hardware design language instructions, or a compilation of the hardware design language instructions, wherein the hardware design language instructions specify an implementation of the apparatus as set forth in claim 1 as an integrated circuit.

16. The article of manufacture of claim 15, wherein the hardware design language instructions comprise either VHDL or Verilog.

* * * * *

UNITED STATES PATENT AND TRADEMARK OFFICE
CERTIFICATE OF CORRECTION

Page 1 of 2

| | |
|---|---|
| PATENT NO. | : 8,521,951 B2 |
| APPLICATION NO. | : 12/015430 |
| DATED | : August 27, 2013 |
| INVENTOR(S) | : Rao |

It is certified that error appears in the above-identified patent and that said Letters Patent is hereby corrected as shown below:

In the Drawings:
In Fig. 4, Sheet 4 or 5, in Box "456", in Line 1, delete "Copy data out" and insert -- Copy out data --, therefor. (as shown on attached drawing sheet)

In the Specifications:
In Column 2, Line 62, delete "114a, 114ba" and insert -- 114a, 114b --, therefor.

Signed and Sealed this
Eighteenth Day of March, 2014

Michelle K. Lee
*Deputy Director of the United States Patent and Trademark Office*

Fig. 4